(12) United States Patent
Rozenblit et al.

(10) Patent No.: US 6,650,875 B1
(45) Date of Patent: Nov. 18, 2003

(54) TRANSMITTER ARCHITECTURE HAVING A SECONDARY PHASE-ERROR CORRECTION LOOP INCLUDING AN AMPLITUDE RECONSTRUCTION SYSTEM

(75) Inventors: Dimitriy Rozenblit, Irvine, CA (US); William J. Domino, Yorba Linda, CA (US); Morten Damgaard, Laguna Hills, CA (US); Nooshin D. Vakilian, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 484 days.

(21) Appl. No.: 09/650,831

(22) Filed: Aug. 30, 2000

(51) Int. Cl.$^7$ .................................................. H04B 1/02
(52) U.S. Cl. .................. 455/91; 455/102; 455/115; 455/118; 455/126; 455/311; 455/314; 332/103; 332/145; 332/151; 375/295; 375/316; 375/320; 375/327; 375/375; 375/376
(58) Field of Search ........................ 455/91, 311–315, 455/102, 118, 115, 126; 332/103, 144, 145, 149, 151; 375/375, 376, 316, 320, 327, 295, 298

(56) References Cited

U.S. PATENT DOCUMENTS

| | | | |
|---|---|---|---|
| 4,600,892 A | * | 7/1986 | Wagner et al. ............... 330/144 |
| 5,420,536 A | * | 5/1995 | Faulkner et al. ............. 330/149 |
| 5,570,063 A | * | 10/1996 | Eisenberg ..................... 330/149 |
| 5,737,703 A | * | 4/1998 | Byrne ........................... 455/442 |
| 5,740,521 A | * | 4/1998 | Hulkko et al. ................. 455/76 |
| 5,825,257 A | * | 10/1998 | Klymyshyn et al. .......... 332/100 |
| 5,880,633 A | * | 3/1999 | Leizerovich et al. ........... 330/84 |
| 6,236,267 B1 | * | 5/2001 | Anzil ........................... 330/149 |
| 6,259,318 B1 | * | 7/2001 | Mielke et al. ................ 330/129 |
| 6,275,685 B1 | * | 8/2001 | Wessel et al. ................ 455/126 |
| 6,295,442 B1 | * | 9/2001 | Camp, Jr. et al. ............ 455/102 |
| 6,377,784 B2 | * | 4/2002 | McCune ....................... 455/108 |
| 6,420,940 B1 | * | 7/2002 | Minnis et al. ................. 332/103 |
| 6,480,704 B1 | * | 11/2002 | Pakonen ....................... 455/126 |
| 6,526,265 B1 | * | 2/2003 | Damgaard et al. ........... 455/118 |

* cited by examiner

Primary Examiner—William Trost
Assistant Examiner—Stephen M. D'Agosta
(74) Attorney, Agent, or Firm—Needle & Rosenberg, P.C.

(57) ABSTRACT

A system for using a translation loop upconverter and power amplifier including a secondary phase-error correction loop uses the output of the upconverter to lock a feedback loop during a time in which the output of the power amplifier is insufficient to provide feedback to the upconverter. After the power amplifier has developed sufficient power to provide feedback to the upconverter, the feedback to the upconverter is taken from the output of the power amplifier. By placing a phase detector and phase shifter in the secondary feedback path taken from the output of the power amplifier, any phase distortion present in the system can be detected and corrected.

33 Claims, 7 Drawing Sheets

TRANSMITTER ARCHITECTURE HAVING A SECONDARY PHASE-ERROR CORRECTION LOOP INCLUDING AN AMPLITUDE RECONSTRUCTION SYSTEM

BACKGROUND OF THE INVENTION

1. Field of the Invention

This invention relates generally to maximizing radio frequency transmission power and minimizing phase-error in a wireless communication device transmitter. More particularly, to a transmitter architecture having a secondary phase-error correction loop including an amplitude reconstruction system.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

As these mobile communication systems have been developed and deployed, many different standards, to which these systems must conform, have evolved. For example, in the United States, third generation portable communications systems comply with the IS-136 standard, which requires the use of a particular modulation scheme and access format. In the case of IS-136, the modulation scheme can be 8-quadrature phase shift keying (8QPSK), offset $\pi/4$ differential quadrature phase shift keying ($\pi/4$-DQPSK) or variations thereof and the access format is TDMA. Other standards may require the use of, for example, CDMA.

Similarly, in Europe, the global system for mobile communications (GSM) standard requires the use of the gaussian minimum shift keying (GMSK) modulation scheme in a narrowband TDMA access environment.

Furthermore, in a typical GSM mobile communication system using narrowband TDMA technology, a GMSK modulation scheme supplies a very clean phase modulated (PM) transmit signal to a non-linear power amplifier directly from an oscillator. In such an arrangement, a non-linear power amplifier, which is highly efficient, can be used thus allowing efficient modulation of the phase-modulated signal and minimizing power consumption. Because the modulated signal is supplied directly from an oscillator, the need for filtering, either before or after the power amplifier, is minimized. Other transmission standards, such as that employed in IS-136, use a modulation scheme where both a PM signal and an amplitude modulated (AM) signal are transmitted. Standards employing these schemes increase the data rate without increasing the bandwidth of the transmitted signal. Unfortunately, even though it would be desirable to have one portable transceiver that can accommodate all of the above-mentioned transmission schemes, existing GSM modulation schemes are not easily adapted to transmit a signal that includes both a PM component and an AM component. One reason for this difficulty is that in order to transmit a distortion free signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. In GSM, this power control is typically performed using a closed feedback loop in which a portion of the signal output from the power amplifier is compared with a reference signal and the resulting error signal is fed back to the input of the power amplifier. Furthermore, in GSM systems, the transmitted signal typically has a constant power envelope, thereby making possible the use of a high efficiency (and therefore, non-linear) power amplifier. Further still, in these burst transmission systems in which the power amplifier output ramps up over a period of time, there is insufficient power amplifier output to provide phase-error correction feedback until the power amplifier can output sufficient power with which to feed back to a translation loop in the upconverter.

When attempting to include a PM component and an AM component in a GSM type modulation system, the power amplifier's non-linearity could negatively affect the quality of the transmitted signal and introduce unrecoverable errors. Also, the transmitter's non-linearity could cause intermodulation products and cause regrowth of the transmit spectrum, thereby causing an unacceptable adjacent channel power ratio. Furthermore, while attempting to include a PM component and an AM component in a GSM type modulation system, the power control loop will tend to fight against the amplitude variations present in the signal while attempting to maintain the desired output power. In such an arrangement, the power control loop tends to cancel the AM portion of the signal within its power control loop bandwidth.

In systems having transmit signals contain both PM and AM components, the output power can be controlled by setting a calibrated control signal on the power amplifier. Unfortunately, this requires the use of a highly linear, and therefore very inefficient, power amplifier. In non-burst transmission systems, the output power may be controlled by a feedback loop having a time-constant that is very low compared to the time-constant of the amplitude variations of the modulator. Another known method is to provide an open loop power control system, but in such a case the system has no control over the transmit power during the burst and the actual power level will likely vary over temperature, load conditions, aging, etc. Unfortunately, these methods are costly and inefficient.

Furthermore, in those transmission standards in which both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

With the increasing desirability of developing one worldwide portable communication standard, it would be desirable to allow portable transceivers to transmit a signal containing both a PM component and an AM component, while maximizing the efficiency of the power amplifier. Furthermore, as the GSM standard evolves further, such as with the development of enhanced data rates for GSM evolution (EDGE), it is desirable to have one portable transceiver that may operate in all systems.

SUMMARY

The invention is a transmitter architecture having a secondary phase-error correction loop including amplitude reconstruction, that maximizes power amplifier efficiency and that compensates for phase-error caused by the power amplifier or any other component in the output path.

The invention maximizes the efficiency of a power amplifier and provides phase-error correction by incorporating a phase shifter in a secondary feedback path. During an initial portion of a transmit burst, an upconverter including a translation loop receives feedback only from a transmit voltage controlled oscillator (VCO). After the output of the power amplifier is sufficient to produce a feedback signal, the feedback signal is processed through a phase detector, the output of which is supplied as an error signal to a phase shifter. The phase detector determines a phase difference between the feedback signal taken from the output of the power amplifier and the input signal to the upconverter. The phase difference is supplied as an error signal from the phase detector to the phase shifter. The phase shifter adjusts the phase of the input signal and supplies a phase-corrected signal to the upconverter. In this manner, the phase detector and the phase shifter compensate for any phase-error introduced by the power amplifier. In order to introduce an AM signal into the transmit path, a control signal supplied to the power amplifier includes an AM signal.

The output signal from the power amplifier is directed through a variable gain element, which removes the AM portion of the power amplifier output. In this manner, the output of the power amplifier is supplied to the input of the upconverter, thereby allowing the translation loop to correct for phase shift induced not only by the VCO but also by the power amplifier. The AM portion of the signal is removed to avoid any additional AM-to-PM conversion in the feedback path.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
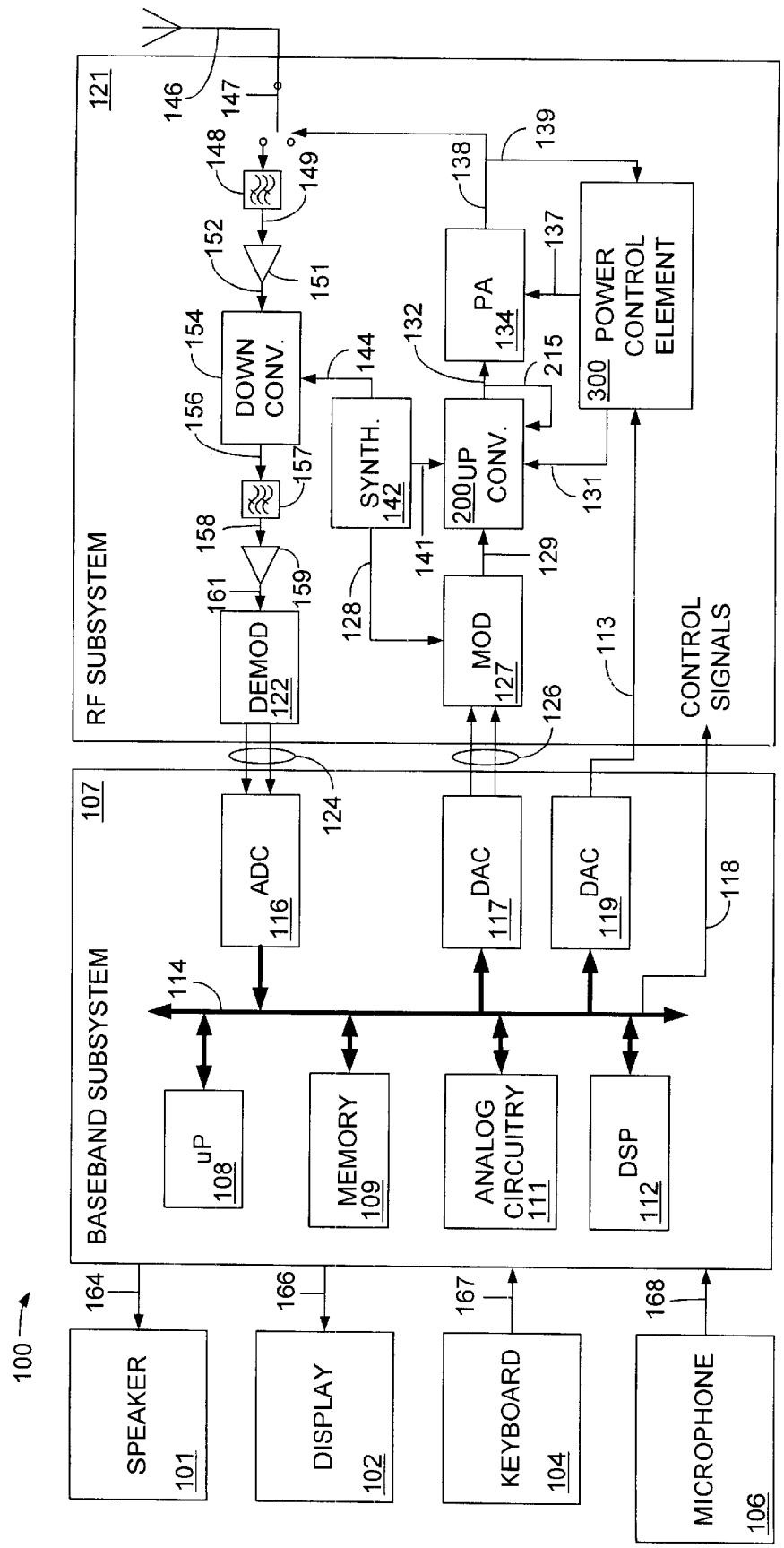
FIG. 1 is a block diagram illustrating a simplified portable transceiver.

Although described with particular reference to a portable transceiver, the transmitter architecture including the secondary phase-error correction loop system of the invention can be implemented in any system where a single PM signal or a combined signal including a PM component and an AM component is supplied to a power amplifier. Furthermore, the transmitter architecture including the secondary phase-error correction loop system is applicable to any transmitter in which it is desirable to implement a closed power control feedback loop and in which a PM signal and an AM signal are supplied to a linear power amplifier.

The transmitter architecture including the secondary phase-error correction loop system can be implemented in software, hardware, or a combination of software and hardware. Selected portions of the transmitter architecture, including the secondary phase-error correction loop system, may be implemented in hardware and software. The hardware portion of the invention can be implemented using specialized hardware elements and logic. The software portion can be stored in a memory and be executed by a suitable instruction execution system (microprocessor). The hardware implementation of the transmitter architecture, including the secondary phase-error correction loop system, can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The transmitter architecture, including the secondary phase-error correction loop software that comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100. Portable transceiver 100 includes speaker 101, display 102, keyboard 104, and microphone 106, all connected to baseband subsystem 107. In a particular embodiment, portable transceiver 100 can be, for example but not limited to, a portable telecommunication handset such as a mobile cellular-type telephone. Speaker and display 102 receive signals from baseband subsystem 107 via connections 164 and 166, respectively, as known to those skilled in the art. Similarly, keyboard 104 and microphone 106 supply signals to baseband subsystem 107 via connections 167 and 168, respectively. Baseband subsystem 107 includes microprocessor ($\mu$P) 108, memory 109, analog circuitry 111, and digital signal processor (DSP) 112 in communication via bus 114. Bus 114, although shown as a single bus, may be implemented using multiple busses connected as necessary among the subsystems within baseband subsystem 107. Microprocessor 108 and memory 109 provide the signal timing, processing and storage functions for portable transceiver 100. Analog circuitry 111 provides the analog processing functions for the signals within baseband subsystem 107. Baseband subsystem 107 provides control signals to radio frequency (RF) subsystem 121 via connection 118. Although shown as a single connection 118, the control signals may originate from DSP 112 or from microprocessor 108, and are supplied to a variety of points within RF subsystem 121. It should be noted that, for simplicity, only the basic components of portable transceiver 100 are illustrated herein.

Baseband subsystem 107 also includes analog-to-digital converter (ADC) 116 and digital-to-analog converters (DACs) 117 and 119. ADC 116, DAC 117 and DAC 119 also communicate with microprocessor 108, memory 109, analog circuitry 111 and DSP 112 via bus 114. DAC 117 converts the digital communication information within baseband subsystem 107 into an analog signal for transmission to RF subsystem 121 via connection 126. In accordance with an aspect of the invention, DAC 119 provides a reference voltage power level signal to power control element 300 via connection 113. Connection 126, while shown as two directed arrows, includes the information that is to be transmitted by RF subsystem 121 after conversion from the digital domain to the analog domain.

RF subsystem 121 includes modulator 127, which, after receiving a frequency reference signal, also called a "local oscillator" signal, or "LO," from synthesizer 142 via connection 128, modulates the received analog information and provides a phase modulated signal via connection 129 to upconverter 200. Upconverter 200 also receives a frequency reference signal from synthesizer 142 via connection 141. Synthesizer 142 determines the appropriate frequency to which upconverter 200 will upconvert the phase modulated signal on connection 129.

Upconverter 200 supplies the phase-modulated signal via connection 132 to power amplifier 134. Power amplifier 134 amplifies the modulated signal on connection 132 to the appropriate power level for transmission via connection 138 to antenna 146. Illustratively, switch 147 controls whether the amplified signal on connection 138 is transferred to antenna 146 or whether a received signal from antenna 146 is supplied to filter 148. The operation of switch 147 is controlled by a control signal from baseband subsystem 107 via connection 118.

A portion of the amplified transmit signal energy on connection 138 is supplied via connection 139 to power control element 300. Power control element 300 may form a closed power control feedback loop and supplies an AM component of the transmit signal via connection 137 to power amplifier 134 and may also supply a power control feedback signal via connection 131 to a secondary phase-error correction loop in upconverter 200. The operation of power control element 300 will be described in further detail with respect to FIGS. 2 through 4 and the operation of upconverter 200 will be described in further detail with respect to FIGS. 2 through 6. In addition, a portion of the output of the upconverter 200 is supplied via connection 215 back to the upconverter 200. The feedback from the upconverter forms a first feedback loop and the feedback from the power amplifier forms a second feedback loop.

A signal received by antenna 146 will, at the appropriate time determined by baseband system 107, be directed via switch 147 to receive filter 148. Receive filter 148 will filter the received signal and supply the filtered signal on connection 149 to low noise amplifier (LNA) 151. Receive filter 148 is a bandpass filter, which passes all channels of the particular cellular system in which the portable transceiver 100 is operating. As an example, for a 900 MHz GSM system, receive filter 148 would pass all frequencies from 935.1 MHz to 959.9 MHz, covering all 124 contiguous channels of 200 kHz each. The purpose of this filter is to reject all frequencies outside the desired region. LNA 151 amplifies the very weak signal on connection 149 to a level at which downconverter 154 can translate the signal from the transmitted frequency back to a baseband frequency. Alternatively, the functionality of LNA 151 and downconverter 154 can be accomplished using other elements, such as for example but not limited to, a low noise block downconverter (LNB).

Downconverter 154 receives a frequency reference signal, also called a "local oscillator" signal, or "LO," from synthesizer 142, via connection 144, which signal instructs the downconverter 154 as to the proper frequency to which to downconvert the signal received from LNA 151 via connection 152. The downconverted frequency is called the intermediate frequency or IF. Downconverter 154 sends the downconverted signal via connection 156 to channel filter 157, also called the "IF filter". Channel filter 157 filters the downconverted signal and supplies it via connection 158 to amplifier 159. The channel filter 157 selects the one desired channel and rejects all others. Using the GSM system as an example, only one of the 124 contiguous channels is actually to be received. After all channels are passed by receive filter 148 and downconverted in frequency by downconverter 154, only the one desired channel will appear precisely at the center frequency of channel filter 157. The synthesizer 142, by controlling the local oscillator frequency supplied on connection 144 to downconverter 154, determines the selected channel. Amplifier 159 amplifies the received signal and supplies the amplified signal via connection 161 to demodulator 122. Demodulator 122 recovers the transmitted analog information and supplies a signal representing this information via connection 124 to ADC 116. ADC 116 converts these analog signals to a digital signal at baseband frequency and transfers it via bus 114 to DSP 112 for further processing.

Figure 2:
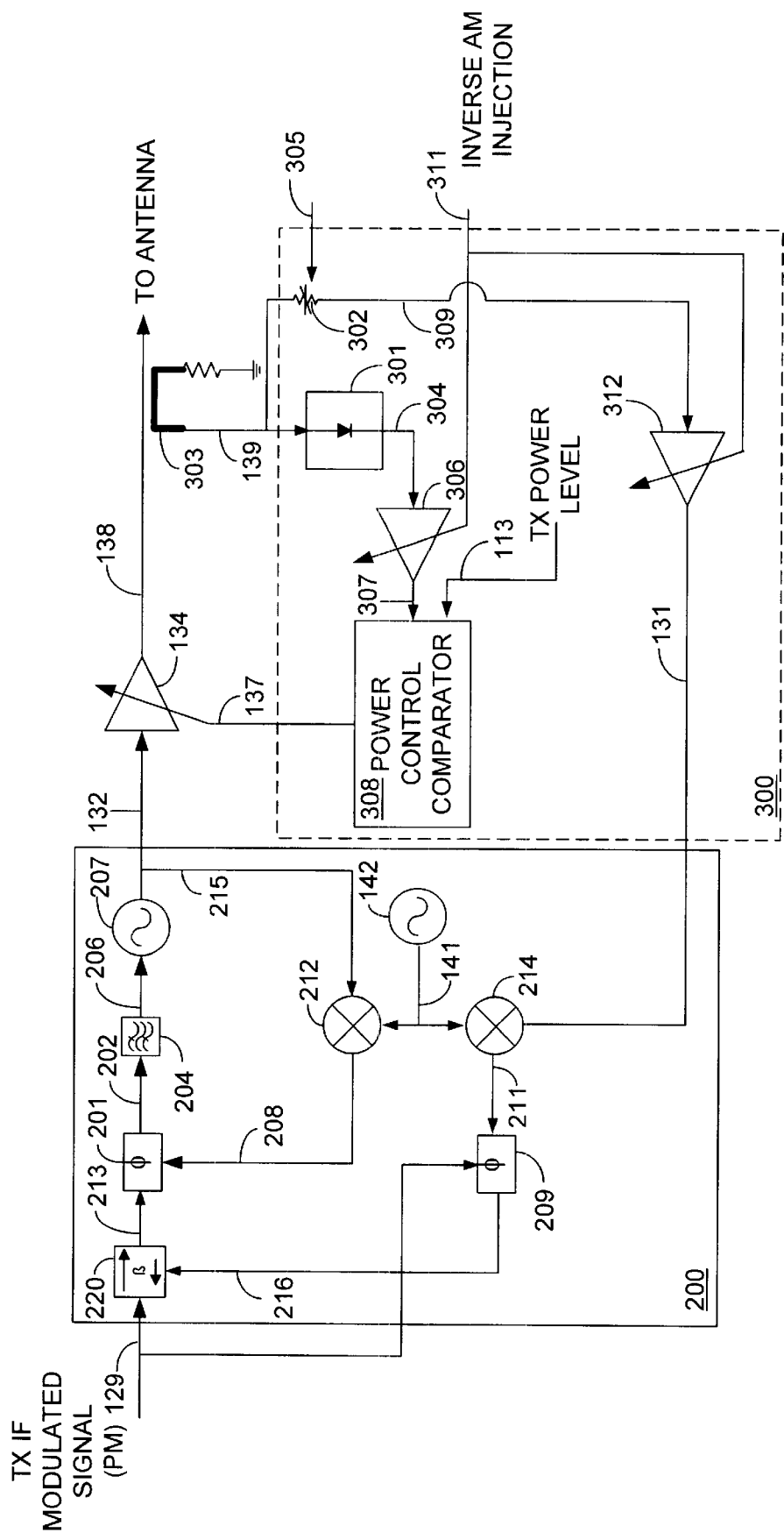
FIG. 2 is a block diagram illustrating the upconverter, the secondary phase-error correction loop, and the power control element.

FIG. 2 is a block diagram illustrating the upconverter 200, including the secondary phase-error correction loop and power control element 300. Upconverter 200 receives an intermediate frequency (IF) modulated signal on connection 129 from modulator 127 (FIG. 1). The IF modulated signal on connection 129 is, for example purposes only, a phase modulated signal. The phase-modulated signal is supplied on connection 129 to phase shifter 220. Phase shifter 220 receives an error signal via connection 216 from phase detector 209. The phase detector 209 develops the error signal on connection 216 by determining the phase difference of the signals on connections 211 and 129 and will be described in greater detail below. The output signal on connection 213 from the phase shifter 220 is a phase-corrected signal and is input to phase detector 201.

Phase detector 201 compares the phase of the signals supplied on connections 213 and 208 and supplies a signal representing the phase difference on connection 202. The output of phase detector 201 is sent via connection 202 to low pass filter 204. Low pass filter 204 filters the signal on connection 202 and passes a signal at the appropriate frequency on connection 206 to transmit (TX) voltage controlled oscillator (VCO) 207. TX VCO 207 supplies a very clean modulated signal (i.e., a signal with very low out-of-band noise) via connection 132 to power amplifier 134. By using an oscillator 207 to supply a low-noise modulated signal to power amplifier 134, the need for filtering before and after the power amp 134 may be reduced or eliminated. The signal supplied from oscillator 207 to power amp 134 contains only a phase-modulated signal.

A portion of the output of TX VCO 207 is sent via connection 215 to mixer 212. Mixer 212 combines the portion of the output of TX VCO 207 on connection 215 with the output of synthesizer 142 (i.e., the local oscillator signal) supplied via connection 141. The output of mixer 212 is then communicated via connection 208 to phase detector 201. Phase detector 201 detects any phase difference between the phase-shifted IF modulated signal on connection 213 and the output of mixer 212 on connection 208, thus ensuring that the frequency of the output of phase detector 201 on connection 202 is defined by the frequency of the local oscillator signal supplied by synthesizer 142. In this manner, connection 215, mixer 212 and synthesizer 142 form a translation loop including a phase locked loop (PLL), which is used to determine the transmit frequency to which the signal input on connection 129 is upconverted. For example, the synthesizer 142 and the mixer 212 ensure that the frequency of the signal output from the TX VCO 207 on connection 132 tracks that of the local oscillator signal supplied by synthesizer 142.

The supply of the feedback signal from the output of the TX VCO 207 via connection 215 is provided during a first portion of a transmit burst. When the power amplifier 134 can supply sufficient power, the additional feedback, which is taken from the output of variable gain element 312 within power control element 300 via connection 131, becomes active. In this manner, during an initial portion of a transmit burst, which corresponds to a time when the output of power amplifier 134 is insufficient to provide any feedback to upconverter 200, the phase locked loop in the upconverter 200 responds to the output of the TX VCO 207 via connection 215. Then, when the output power of the TX VCO 207 reaches a level at which it can drive the power amplifier 134 with sufficient power, the feedback for the upconverter 200 is taken from the output of the power amplifier 134 through variable gain element 312 in power control element 300 (to be described below) in addition to the existing feedback provided via connection 215 from the output of TX VCO 207.

Unfortunately, when the PM portion and AM portion of the signal are combined in, or supplied to, power amplifier 134, some unwanted phase modulation may be present on connection 138, thus resulting in undesirable AM-to-PM conversion or in phase-error imparted to the PM signal. In order to prevent this unwanted AM-to-PM conversion, and in accordance with another aspect of the invention, the AM component of the signal is introduced into the control input of the power amplifier 134 along with the power control signal via connection 137. Accordingly, the detected portion of the power output on connection 139 is also supplied to attenuator 302. Attenuator 302 reduces the power of the signal and supplies the reduced power signal on connection 309 to the input of variable gain element 312. Variable gain element 312 may be, for example, a variable gain amplifier or an attenuator. The control input to variable gain element 312 is an inverse of the AM injected signal and is supplied via connection 311. The signal supplied is an inverse of the desired AM signal because it is desirable to cancel or reduce any AM component present in the feedback path to avoid any AM-to-PM conversion.

The output of variable gain element 312 is supplied on connection 131 for input to mixer 214. Amplifier 312 could be, for example but not limited to, a limiting amplifier. This second error correction loop via connection 131 automatically becomes active when the output power of power amplifier 134 becomes sufficient to provide feedback. Mixer 214 downconverts the signal on connection 131 according to the frequency of the local oscillator output of synthesizer 142 and provides this signal to phase detector 209 via connection 211. The signal on connection 211 is at the same frequency as that of the modulated input signal on connection 129. Phase detector 209 compares the phase of the signals on connections 211 and 129 and develops an error signal, in the form of a direct current (DC) control voltage, which is supplied via connection 216 to phase shifter 220. Phase shifter 220 adjusts the phase of the signal on connection 129 as a function of the error signal on connection 216, thereby providing a phase corrected signal on connection 213. In this manner, phase shifter 220, via this secondary phase-error correction loop, compensates any phase-error present in the output of power amplifier 134, and furthermore, corrects for any phase-error introduced anywhere in the upconverter 200, power amplifier 134 or the power control element 300. The PLL now includes the entire feedback loop essentially looping back the output of power amplifier 134 to the input of phase detector 201, thereby ensuring that any unwanted phase shift generated by the power amplifier 134 will be corrected by the local oscillator signal provided by synthesizer 142 and mixers 212 and 214. In accordance with this aspect of the invention, the output of variable gain element 312 on connection 131 is preferably a constant amplitude signal that passes any phase distortion present on connection 138 to mixer 214 for correction by the local oscillator signal provided by synthesizer 142.

It is desirable to have the ability for power amplifier 134 to output a signal including both a PM signal and an AM signal. Unfortunately however, there are many drawbacks associated with supplying both a PM signal and an AM signal directly to power amplifier 134 via connection 132. For example, in order to amplify both a PM signal and an AM signal in amplifier 134, it would be necessary that amplifier 134 be a highly linear, and therefore very inefficient power amplifier. A highly linear power amplifier is typically required to amplify both a PM and an AM signal in order to prevent undesirable and detrimental AM-to-PM conversion. AM-to-PM conversion occurs due to the inherent amplitude-dependence of an amplifier's phase-shift characteristic, which is most severe in the case of highly efficient amplifiers. In such amplifiers, the signal's AM causes the phase to be modulated as the amplifier's phase-shift characteristic varies with the signal amplitude, resulting in a distorted transmit signal. Unfortunately, linear amplifiers, which have low AM-to-PM conversion, are highly inefficient.

Therefore, because it is desirable to allow power amplifier 134 to output a signal containing both an AM component and a PM component, while maintaining power amplifier 134 as a non-linear (and therefore highly efficient) power amplifier, the AM portion of the signal is introduced into power amplifier 134 through its control channel via connection 137. A portion of the output power present at the output of power amplifier 134 on connection 138 is diverted by coupler 303 via connection 139 and input to power control element 300. A portion of the output power of power amplifier 134 is supplied on connection 139 to logarithmic (log) detector 301. Log detector 301 receives the RF signal on connection 139 and provides, on connection 304, a direct current (DC) baseband signal representing the level of the RF power signal present on connection 139. The output of log detector 301 on connection 304 is supplied as input to variable gain element 306.

Variable gain element 306 can be, for example but not limited to, a variable gain amplifier or an attenuator. An inverse version of the desired AM signal is injected via connection 311 to the variable input of variable gain element 306. In this manner, the output of variable gain element 306 "unmodulates" the output of the power amplifier 134. The output of the variable gain element 306 on connection 307 includes only that AM related to the absolute output power of power amplifier 134. This power measurement signal on connection 307 is supplied to the inverting port of power control comparator 308 in which it is compared with a reference voltage power signal supplied on connection 113 from DAC 119 of FIG. 1. Power control comparator 308 compares the signal level on connection 307 with the signal level on connection 113 and provides an error signal, in the form of a DC control voltage, on connection 137. The error signal on connection 137 represents the difference between the output power measured from the power amplifier 134 and the desired output level supplied on connection 113 and is used to control the output of power amplifier 134. In this manner, the desired AM portion of the signal is supplied to the control input 137 of power amplifier 134 and then amplified and made present on the output on connection 138. Log detector 301, variable gain element 306, and power control comparator 308 provide a closed power control feedback loop to control the power output of power amplifier 134, while allowing for the introduction of the AM portion of the transmit signal.

It should be noted that the operation of variable gain element 306 causes the inverse of the AM signal on connection 311 to be present on connection 307 (assuming a high gain power control loop), thereby essentially providing a constant amplitude signal on connection 307 for comparison with the desired TX power level signal on connection 113. The power control loop attempts to keep the output of the power control comparator 308 constant. Accordingly, the power control loop generates a signal having a phase opposite that of the AM signal injected via connection 311. The signal on connection 311 modulates the power amplifier 134 and attempts to unmodulate the variable gain element 306. Thus, the actual value of the AM component observed on connection 307 is smaller than the injected AM signal by a value of the loop gain.

Figure 3:
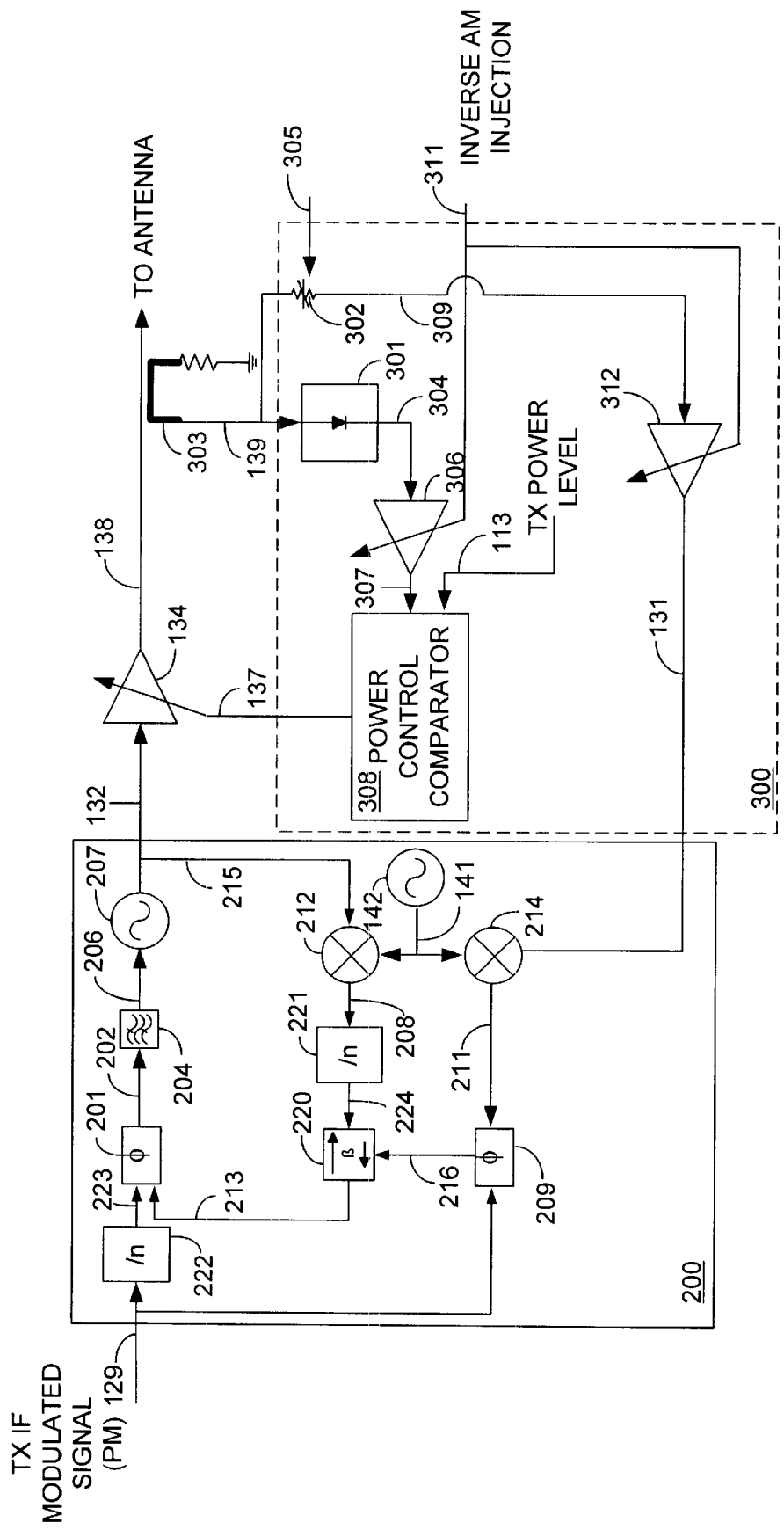
FIG. 3 is a block diagram illustrating another aspect of the upconverter and the secondary phase-error correction loop of FIG. 2.

FIG. 3 is a block diagram illustrating another aspect of the upconverter 200 and the secondary phase-error correction loop of FIG. 2. Elements identical to those described above with respect to FIG. 2 are like numbered and will not again be described in detail. As illustrated in FIG. 3, the output of TX VCO 207 is supplied via connection 215 to mixer 212 during a first time period, during which the output of power amplifier 134 is insufficient to provide any significant feedback to the translation loop PLL within upconverter 200. The output of mixer 212 includes the output of TX VCO supplied via connection 215 combined with the local oscillator frequency signal supplied via synthesizer 142, yielding a signal having the desired transmit frequency on connection 208. The output of mixer 212 is supplied via connection 208 to divider 221. Because the output of the TX VCO 207 is still a part of the feedback correction loop, the output phase-error is reduced based on the settings of the dividers 221 and 222 and could be calculated as 1+n/1, so that if n=1, then any phase-error present on connection 215 will be suppressed by a factor of 2. The output of divider 221 is supplied via connection 224 to phase shifter 220.

Phase shifter 220 also receives the output of phase detector 209 via connection 216. The signal supplied on connection 216 is an error signal, characterized by a DC voltage that determines the extent to which the phase shifter 220 alters the phase of the signal on connection 224. The phase shifter 220 supplies this phase-corrected signal via connection 213 to phase detector 201. Phase detector 201 compares the phase of the signal on connections 213 and 223 and supplies a phase-error signal on connection 202. The phase error signal on connection 202 is then integrated by filter 204 to provide a control voltage on connection 206 to TX VCO 207. In this manner, the feedback from the power amplifier via connection 131 is introduced, through phase detector 209 via connection 216, to the first feedback loop. The operation of the balance of the circuitry in FIG. 3 is the same as described above with respect to FIG. 2.

Figure 4:
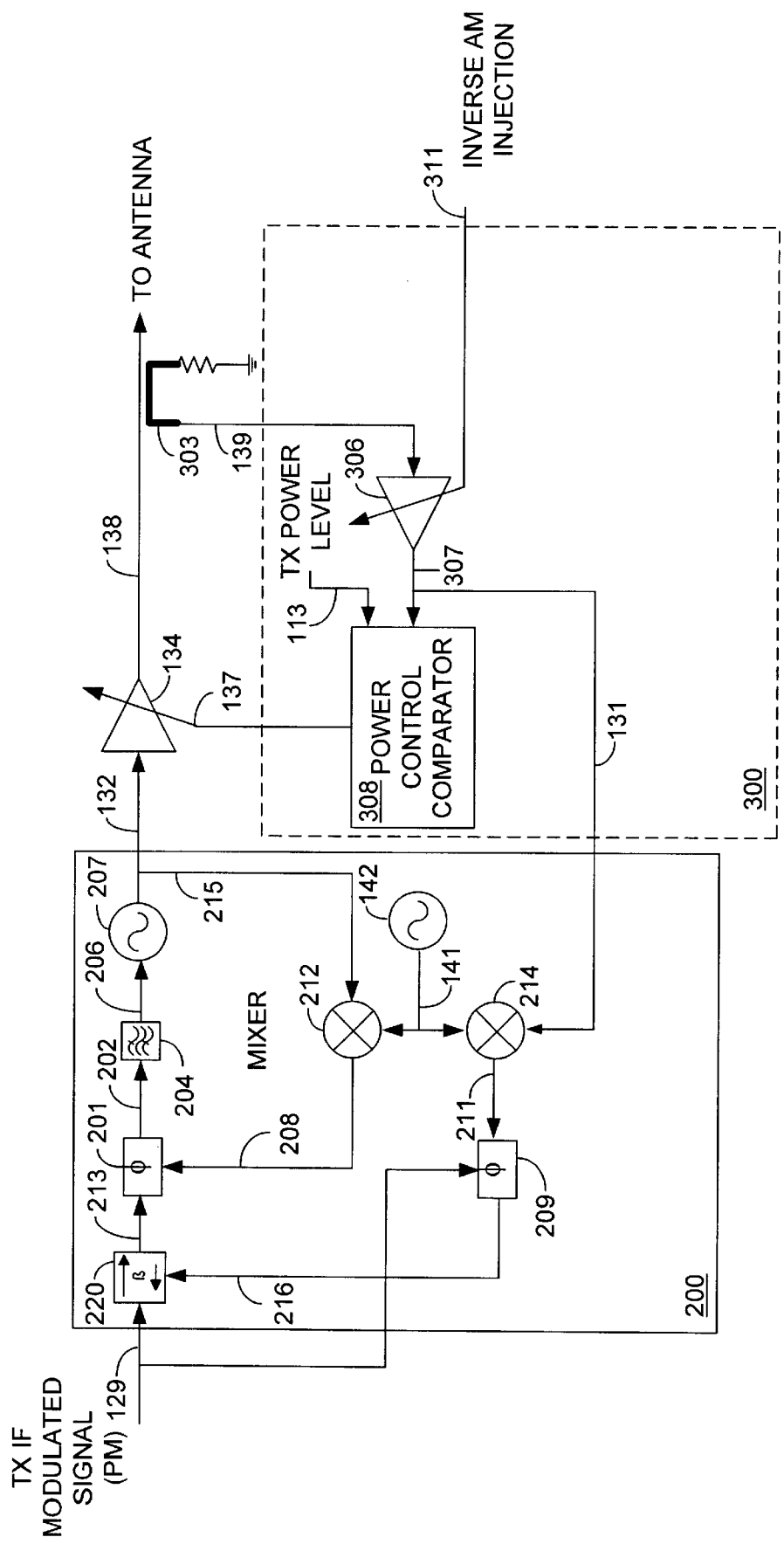
FIG. 4 is block diagram illustrating another aspect of the power control element of FIG. 2.

FIG. 4 is a block diagram illustrating another aspect of the power control element 300 of FIG. 2. Elements that perform the same function as described above with respect to FIGS. 2 and 3 are like numbered and will not again be described in detail. As illustrated in FIG. 4, a single variable gain element 306 supplies both the input to power control comparator 308 and the input to mixer 214 via connection 131. In this manner, a single variable gain element 306 can provide both AM injection and a constant envelope signal for a phase correction feedback path as described above with respect to FIG. 2.

Figure 5:
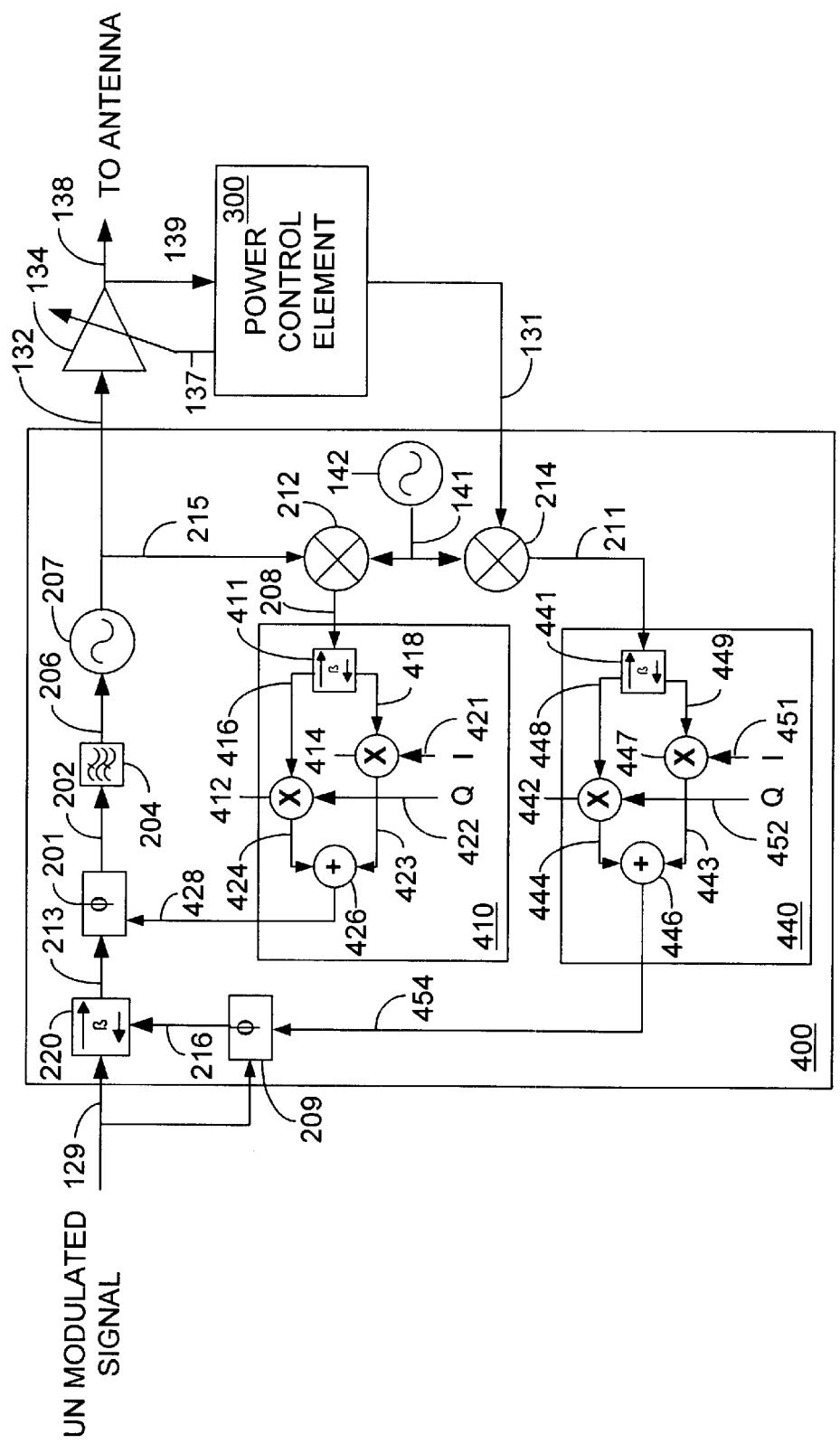
FIG. 5 is a block diagram illustrating another aspect of the upconverter and the secondary phase-error correction loop of FIG. 2.

FIG. 5 is a block diagram illustrating another aspect of the upconverter 200 and the secondary phase-error correction loop of FIG. 2. The power control element depicted in FIG. 5 has been simplified, however, all variations of the power control element 300 discussed can be applied to the upconverter 400 of FIG. 5. In FIG. 5 the output of mixer 212 is supplied via connection 208 to modulator 410. If modulator 410 is employed, then an unmodulated signal is supplied as input to phase shifter 220 on connection 129.

Modulator 410 includes phase shifter 411, which, according to this aspect of the invention, shifts the phase of the signal on connection 208 by 90 degrees, and supplies outputs via connections 416 and 418 to rotators 412 and 414, respectively. The in-phase (I) component of the transmit signal is supplied via connection 421 to rotator 414 and the quadrature (Q) component of the signal is supplied via connection 422 to rotator 412. The output of rotator 414 is the modulated phase-rotated in-phase component of the transmit signal and is supplied on connection 423 to adder 426. The output of rotator 412 is the modulated phase-rotated quadrature component of the transmit signal and it is supplied on connection 424 to adder 426. Adder 426 supplies the combined modulated transmit signal via connection 428 to phase detector 201. By placing modulator 410 in the phase locked loop of upconverter 400, the modulated signal on connection 428 is subtracted from phase detector 201, thereby ensuring that the desired modulated signal is present at the output of TX VCO 207.

Similarly, modulator 440 receives the output of mixer 214 via connection 211. Modulator 440 includes phase shifter 441, which, according to this aspect of the invention, shifts the phase of the signal on connection 211 by 90 degrees, and supplies outputs via connections 448 and 449 to rotators 442 and 447, respectively. The in-phase (I) component of the transmit signal is supplied via connection 451 to rotator 447 and the quadrature (Q) component of the signal is supplied via connection 452 to rotator 442. The output of rotator 447 is the modulated phase-rotated in-phase component of the transmit signal and is supplied on connection 443 to adder 446. The output of rotator 442 is the modulated phase-rotated quadrature component of the transmit signal and it is supplied on connection 444 to adder 446. Adder 446 supplies the combined modulated transmit signal via connection 454 to phase detector 209.

By placing modulators 410 and 440 in the translation loop of upconverter 400, the modulated signal on connection 428 and 454 is subtracted from phase detectors 201 and 209, respectively, thereby ensuring that the desired modulated signal is present at the output of TX VCO 207.

Figure 6:
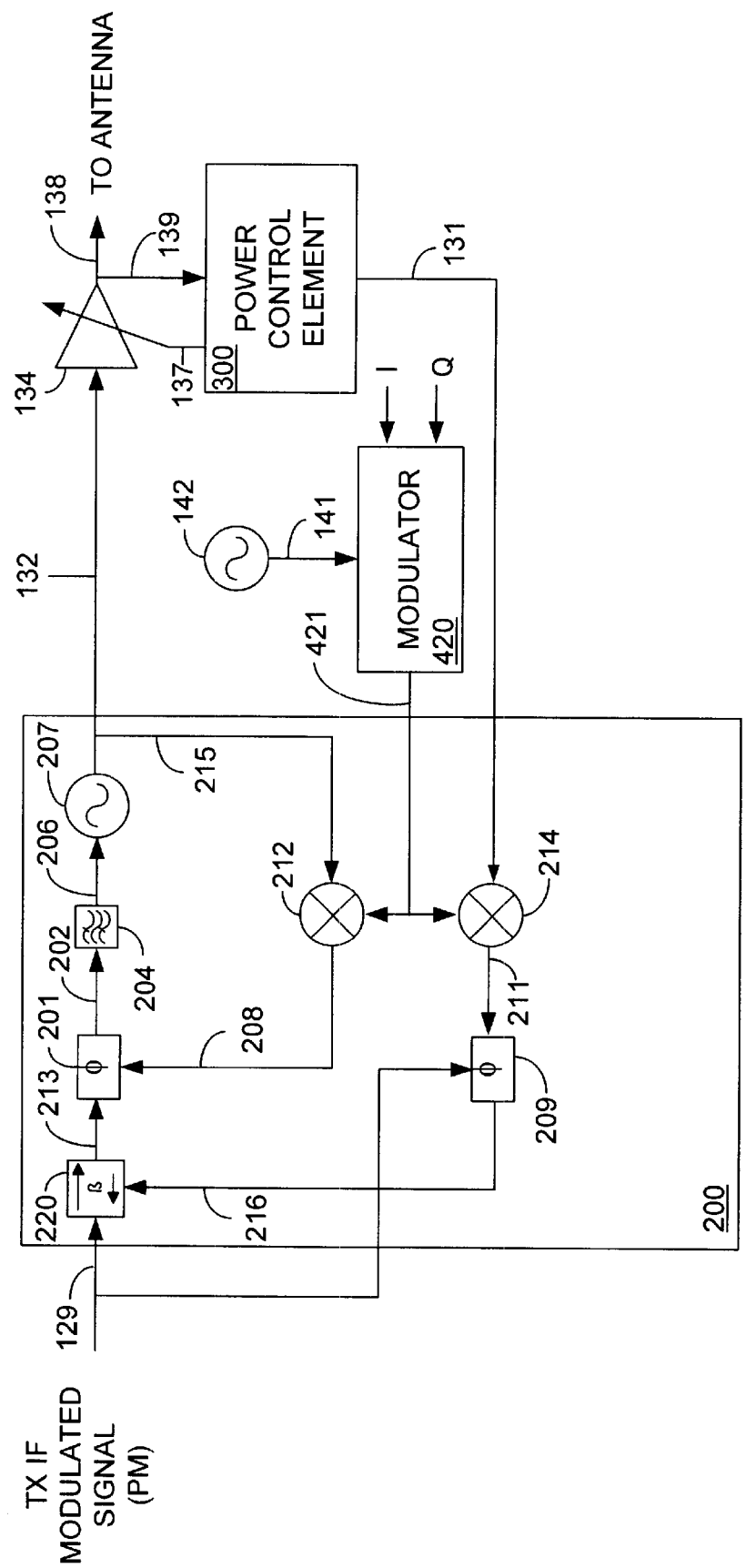
FIG. 6 is a block diagram illustrating another aspect of the upconverter and the secondary phase-error correction loop of FIG. 2.

FIG. 6 is a block diagram illustrating another aspect of the upconverter 200 and the secondary phase-error correction loop of FIG. 2. As illustrated in FIG. 6, modulator 420 is placed at the output of synthesizer 142 where the in-phase and quadrature components of the transmit signal are modulated in modulator 420 and supplied via connection 421 to mixers 212 and 214. In this manner, the modulated transmit signal is introduced into the phase locked loop of upconverter 200.

Figure 7:
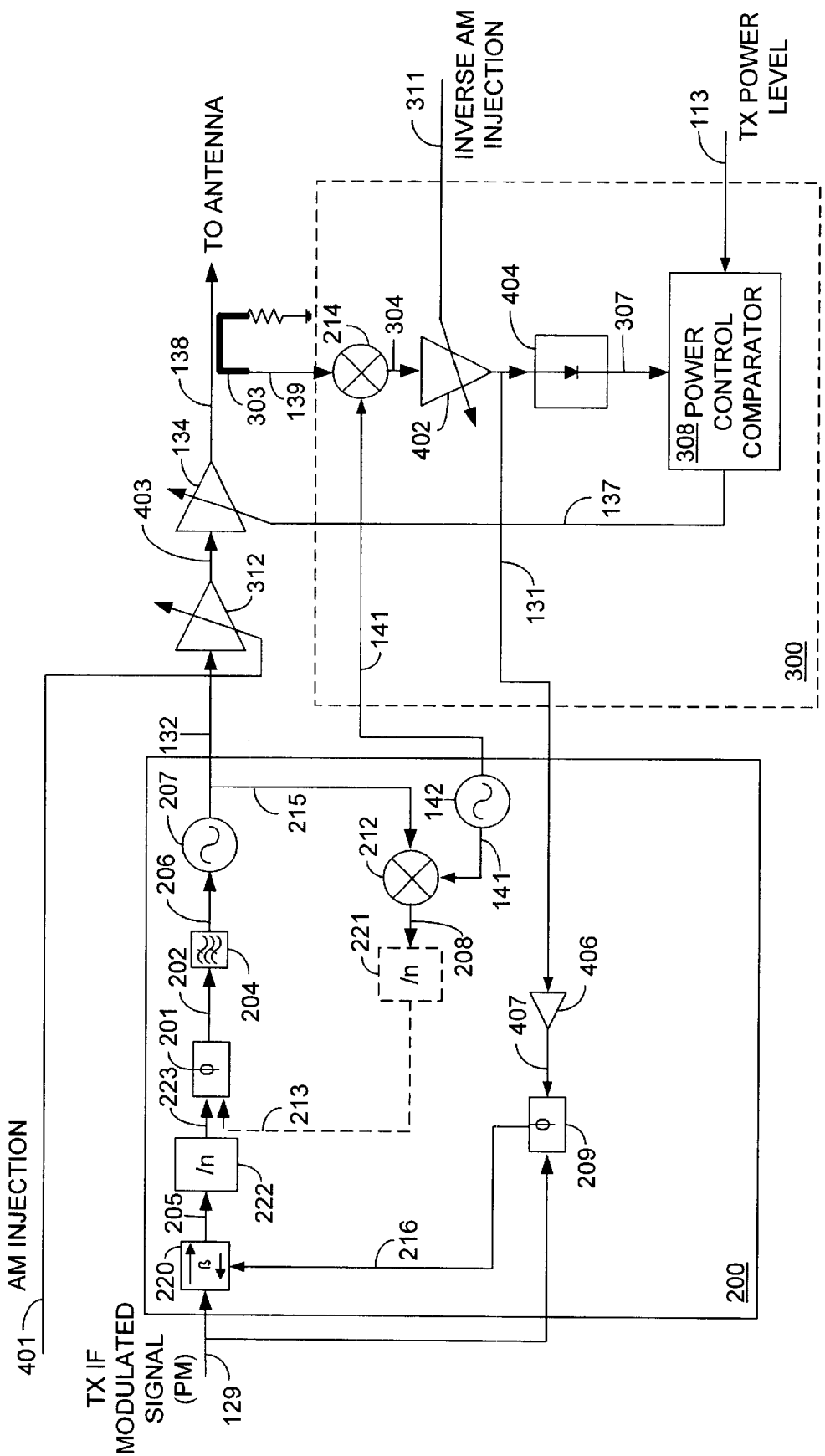
FIG. 7 is a block diagram illustrating another aspect of the upconverter and the secondary phase-error correction loop of FIG. 2.

FIG. 7 is a block diagram illustrating another aspect of the upconverter 200 and the secondary phase-error correction loop of FIG. 2. Elements identical to those described above with respect to FIGS. 2 and 3 are like numbered and will not again be described in detail. As illustrated in FIG. 7, the output of TX VCO 207 is supplied via connection 215 to mixer 212 during a first time period, during which the output of power amplifier 134 is insufficient to provide feedback to the translation loop PLL within upconverter 200. The output of mixer 212 includes the output of TX VCO supplied via connection 215 combined with the local oscillator frequency signal supplied via synthesizer 142, yielding a signal having the desired transmit frequency on connection 208. The output of mixer 212 is supplied via connection 208 to optional divider 221. The output of divider 221 is supplied via connection 213 to phase detector 201. Phase detector 201 compares the phase of the signal on connections 213 and 223 and supplies a phase-error signal on connection 202. The phase-error signal on connection 202 is then integrated by filter 204 to provide a control voltage on connection 206 to TX VCO 207.

The output of TX VCO 207 on connection 132 is supplied to variable gain element 312, the purpose of which is to impose the AM signal onto the PM modulated output of the TX VCO 207. The desired AM signal is supplied via connection 401 to the control input of variable gain element 312 so that the output of the variable gain element 312 on connection 403 includes both the PM component and the AM component of the signal. The output of the variable gain element 312 is supplied to power amplifier 134.

A portion of the output power present at the output of power amplifier 134 on connection 138 is diverted by coupler 303 via connection 139 to mixer 214. Mixer 214 also receives the local oscillator signal on connection 141 from synthesizer 142 and supplies, via connection 304, an intermediate frequency (IF) signal including the AM and PM components representing the power output to IF variable gain element 402. The IF variable gain element 402 unmodulates the AM portion of the signal on connection 304 and supplies an IF signal having only the PM component to log detector 404. By supplying the inverse of the desired AM signal to the control input of the IF variable gain element 402 via connection 311, the IF variable gain element 402 unmodulates the AM portion of the signal. The output of the IF variable gain element 402 is supplied to the log detector 404 via connection 131.

Because the input signal to the log detector 404 is free of any AM component, small inaccuracies in the log detector response can be tolerated more easily than in the case in which AM is supplied to the log detector 404. Furthermore, because the log detector operates at a single IF frequency instead of multiple RF frequencies, it is simple to implement. The output of the log detector 404 is supplied to the inverting port of power control comparator 308, in which it is compared with a reference voltage power signal supplied on connection 113 from DAC 119 of FIG. 1. Power control comparator 308 compares the signal level on connection 307 with the signal level on connection 113 and provides an error signal, in the form of a DC control voltage, on connection 137. The error signal on connection 137 represents the difference between the output power measured from the power amplifier 134 and the desired output level supplied on connection 113 and is used to control the output of power amplifier 134.

When the power amplifier 134 can supply sufficient power the additional feedback is taken from the output of IF variable gain element 402 via connection 131. This feedback signal is supplied to limiting amplifier 406, which could also be a variable gain amplifier, and which scales the signal, and supplies the feedback via connection 407 to phase detector 209. Phase detector 209 compares the phase of the signals on connections 407 and 129 and develops an error signal, in the form of a direct current (DC) control voltage, which is supplied via connection 216 to phase shifter 220. Phase shifter 220 adjusts the phase of the signal on connection 129 as a function of the error signal on connection 216, thereby providing a phase corrected signal on connection 205. In this manner, phase shifter 220, via this secondary phase-error correction loop, compensates any phase-error present in the output of power amplifier 134, and furthermore, corrects for any phase-error introduced anywhere in the upconverter 200, power amplifier 134 or the power control element 300.

During an initial portion of a transmit burst that corresponds to a time when the output of power amplifier 134 is insufficient to provide any significant feedback to upconverter 200, the phase locked loop in the upconverter 200 responds to the output of the TX VCO 207 via connection 215. Then, when the output power of the TX VCO 207 reaches a level at which it can drive the power amplifier 134 with sufficient power, the secondary phase correcting feedback for the upconverter 200 is taken from the output of the power amplifier 134 through IF variable gain element 402 in addition to the existing feedback provided via connection 215 from the output of TX VCO 207.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for using a translation loop modulator and power amplifier in a phase and amplitude modulated transmission environment including a secondary phase-error correction loop, comprising the steps of:

providing a first modulated signal to a translation loop, the translation loop providing a frequency specific modulated signal, the translation loop also having a phase locked loop;

providing the frequency specific modulated signal to a power amplifier;

providing a second modulated signal to the power amplifier using a variable gain element;

detecting a portion of an output of the translation loop and a portion of an output power of the power amplifier;

applying the detected output portion of the translation loop to an input of the translation loop during a first time period;

applying the detected output power portion of the power amplifier to the input of the translation loop during a second time period;

detecting a phase difference between the first modulated signal and the detected output power portion of the power amplifier;

developing an error signal based on the detected phase difference; and supplying the error signal to a phase shifter, the phase shifter configured to adjust a phase of the first modulated signal to compensate for any phase variation present in the detected output power portion of the power amplifier.

2. The method of claim 1, wherein the variable gain element is a variable gain amplifier.

3. The method of claim 1, wherein the variable gain element is an attenuator.

4. The method of claim 1, wherein the first modulated signal is a phase modulated signal.

5. The method of claim 1, wherein the second modulated signal is an amplitude modulated signal.

6. The method of claim 1, wherein the variable gain element operates on a radio frequency (RF) signal.

7. The method of claim 1, wherein the variable gain element operates on a baseband signal representing the radio frequency (RF) power level of the output power of the power amplifier.

8. The method of claim 1, wherein the first time period and the second time period overlap.

9. The method of claim 1, wherein the detected output power portion of the power amplifier is applied to the input of the translation loop using a second variable gain element.

10. The method of claim 1, wherein the detected output portion of the translation loop forms a first feedback loop.

11. The method of claim 1, wherein the detected output power portion of the power amplifier forms a second feedback loop.

12. A system for using a translation loop modulator and power amplifier in a phase and amplitude modulated transmission environment including a secondary phase-error correction loop, comprising:

a translation loop having a phase locked loop and configured to receive a first modulated signal, the translation loop also configured to provide a frequency specific modulated signal;

a power amplifier configured to receive the frequency specific modulated signal;

a variable gain element configured to provide a second modulated signal to the power amplifier;

a first mixer configured to receive a portion of an output of the translation loop during a first time period;

a second mixer configured to receive a portion of an output power of the power amplifier during a second time period;

a phase detector configured to receive the output of the second mixer and the first modulated signal, the phase detector configured to provide an error signal; and a phase shifter configured to adjust a phase of the first modulated signal to compensate for any phase variation present in the detected output power portion of the power amplifier.

13. The system of claim 12, wherein the variable gain element is an amplifier.

14. The system of claim 12, wherein the variable gain element is an attenuator.

15. The system of claim 12, wherein the first modulated signal is a phase modulated signal.

16. The system of claim 12, wherein the second modulated signal is an amplitude modulated signal.

17. The system of claim 12, wherein the variable gain element operates on a radio frequency (RF) signal.

18. The system of claim 12, wherein the variable gain element operates on a baseband signal representing the radio frequency (RF) power level of the output power of the power amplifier.

19. The system of claim 12, wherein the first time period and the second time period overlap.

20. The system of claim 12, further comprising a second variable gain element configured to apply the detected output power portion of the power amplifier to the translation loop.

21. The system of claim 12, wherein the detected output portion of the translation loop forms a first feedback loop.

22. The system of claim 12, wherein the detected output power portion of the power amplifier forms a second feedback loop.

23. A method for correcting phase-error in a transmitted signal using a translation loop modulator and power amplifier including a secondary phase-error correction loop, comprising the steps of:

providing a modulated signal to a translation loop, the translation loop providing a frequency specific modulated signal;

providing the frequency specific modulated signal to a power amplifier;

detecting a portion of an output of the translation loop and a portion of an output power of the power amplifier;

applying the detected output portion of the translation loop to an input of the translation loop during a first time period;

applying the detected output power portion of the power amplifier to the input of the translation loop during a second time period;

detecting a phase difference between the modulated signal and the detected output power portion of the power amplifier;

developing an error signal based on the detected phase difference; and supplying the error signal to a phase shifter, the phase shifter configured to adjust a phase of the modulated signal to compensate for any phase variation present in the detected output power portion of the power amplifier.

24. The method of claim 23, wherein the first time period and the second time period overlap.

25. The method of claim 23, wherein the detected output power portion of the power amplifier is applied to the input of the translation loop using a variable gain element.

26. The method of claim 23, wherein the detected output portion of the translation loop forms a first feedback loop.

27. The method of claim 23, wherein the detected output power portion of the power amplifier forms a second feedback loop.

28. A system for correcting phase-error in a transmitted signal using a translation loop modulator and power amplifier including a secondary phase-error correction loop, comprising:
- a translation loop configured to receive a modulated signal, the translation loop also configured to provide a frequency specific modulated signal;
- a power amplifier configured to receive the frequency specific modulated signal;
- a first mixer configured to receive a portion of an output of the translation loop during a first time period;
- a second mixer configured to receive a portion of an output power of the power amplifier during a second time period;
- a phase detector configured to receive the output of the second mixer and the first modulated signal, the phase detector configured to provide an error signal; and
- a phase shifter configured to adjust a phase of the modulated signal to compensate for any phase variation present in the detected output power portion of the power amplifier.

29. The system of claim 28, wherein the first time period and the second time period overlap.

30. The system of claim 28, wherein the detected output power portion of the power amplifier is applied to the input of the translation loop using a variable gain element.

31. The system of claim 28, wherein the detected output portion of the translation loop forms a first feedback loop.

32. The system of claim 28, wherein the detected output power portion of the power amplifier forms a second feedback loop.

33. A system for correcting phase-error in a transmitted signal using a translation loop modulator and power amplifier including a secondary phase-error correction loop, comprising:
- means for providing a modulated signal to a translation loop, the translation loop providing a frequency specific modulated signal;
- means for providing the frequency specific modulated signal to a power amplifier;
- means for detecting a portion of an output of the translation loop and a portion of an output power of the power amplifier;
- means for applying the detected output portion of the translation loop to an input of the translation loop during a first time period;
- means for applying the detected output power portion of the power amplifier to the input of the translation loop during a second time period;
- means for detecting a phase difference between the modulated signal and the detected output power portion of the power amplifier;
- means for developing an error signal based on the detected phase difference; and
- means for supplying the error signal to a phase shifter, the phase shifter configured to adjust a phase of the modulated signal to compensate for any phase variation present in the detected output power portion of the power amplifier.

* * * * *